United States Patent
Miller

(10) Patent No.: US 7,825,652 B2
(45) Date of Patent: Nov. 2, 2010

(54) METHOD AND APPARATUS FOR REMOTELY BUFFERING TEST CHANNELS

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 156 days.

(21) Appl. No.: 12/273,408

(22) Filed: Nov. 18, 2008

(65) Prior Publication Data

US 2009/0132190 A1    May 21, 2009

Related U.S. Application Data

(62) Division of application No. 10/937,470, filed on Sep. 9, 2004, now Pat. No. 7,453,258.

(51) Int. Cl.
*G01R 31/28* (2006.01)

(52) U.S. Cl. ..................... 324/158.1; 324/533

(58) Field of Classification Search ............. 324/158.1, 324/715, 751, 752, 76.36, 763–765, 508, 324/609, 66, 713, 244, 253; 714/727, 704, 714/709, 735; 257/115, 157, 190, 160
See application file for complete search history.

(56) References Cited

U.S. PATENT DOCUMENTS

| | | | |
|---|---|---|---|
| 5,930,188 A | 7/1999 | Roohparvar et al. | |
| 5,966,318 A | 10/1999 | Ramer et al. | |
| 6,055,287 A * | 4/2000 | McEwan | 375/376 |
| 6,094,377 A | 7/2000 | Roohparvar et al. | |
| 6,157,231 A | 12/2000 | Wasson | |
| 6,442,674 B1 | 8/2002 | Lee et al. | |
| 6,445,228 B1 | 9/2002 | Nguyen | |
| 6,603,323 B1 | 8/2003 | Miller | |
| 7,058,871 B2 | 6/2006 | Whetsel | |
| 7,154,259 B2 | 12/2006 | Miller | |
| 7,250,772 B2 * | 7/2007 | Furse et al. | 324/534 |
| 7,453,258 B2 | 11/2008 | Miller | |

* cited by examiner

*Primary Examiner*—Minh N Tang
*Assistant Examiner*—Trung Q Nguyen
(74) *Attorney, Agent, or Firm*—Kirton & McConkie

(57) ABSTRACT

A system is provided to enable leakage current measurement or parametric tests to be performed with an isolation buffer provided in a channel line. Multiple such isolation buffers are used to connect a single signal channel to multiple lines. Leakage current measurement is provided by providing a buffer bypass element, such as a resistor or transmission gate, between the input and output of each buffer. The buffer bypass element can be used to calibrate buffer delay out of the test system by using TDR measurements to determine the buffer delay based on reflected pulses through the buffer bypass element. Buffer delay can likewise be calibrated out by comparing measurements of a buffered and non-buffered channel line, or by measuring a device having a known delay.

6 Claims, 9 Drawing Sheets

METHOD AND APPARATUS FOR REMOTELY BUFFERING TEST CHANNELS

BACKGROUND

1. Technical Field

The present invention relates in general to distributing a signal to multiple lines through isolation buffers to prevent signal degradation. More particularly, the present invention relates to a system for connecting a single test signal channel of a wafer test system through buffers to multiple test probes to enable testing of integrated circuits (ICs) on a wafer.

2. Related Art

Fanning out a signal to multiple transmission lines, as illustrated in FIG. 1, in many cases requires that the signal arrive at multiple destinations with an equal phase shift. For example to fan out a clock signal, a clock tree is used to distribute the clock signal so that signals arriving on multiple lines are synchronized, or distributed without a phase difference at the line destinations. Typically to assure no phase difference, the multiple transmission lines are laid out to have the same length. In some cases, however, it may be impossible to route the multiple lines so that all are the same length. Further, a fault or line degradation may occur on one of the multiple lines that can create a return signal causing interference and significant attenuation of signals on other lines.

Isolation buffers may be provided in the path of each of the multiple transmission lines, as illustrated in FIG. 2, to reduce the effect of faults. Unfortunately, the isolation buffer circuitry will not only add delay to the signals, but it will typically introduce an arrival delay uncertainty, or effectively create phase differences at the destination of the multiple transmission lines. Circuit construction variations and temperature variations are typical contributors to delay variations from one buffer circuit to another that can prove problematic to synchronous circuits.

Although a clock tree provides one example where a signal should be distributed synchronously, it would be convenient to provide such a distribution in other systems if equal phase delays could be maintained. FIG. 3 shows a simplified block diagram of one such system—a test system for testing ICs on a semiconductor wafer. The test system includes a tester 2 made up of a test controller 4 connected by a communication cable 6 to a test head 8. The test system further includes a prober 10 made up of a stage 12 for mounting a wafer 14 being tested, the stage 12 being moved into contact with probes 16 on the probe card 18, the probes 16 being for example resilient spring probes, pogo pins, cobra type probes, conductive bumps or other forms of probes for contacting ICs that are known in the art. Cameras 20 and 22 are shown attached to the prober 10 and the test head 8 to enable precise alignment of the probes 16 with contacts of ICs formed on the wafer 14.

In the test system, test data is generated by the test controller 4 and transmitted through the communication cable 6 to the test head 8. Test results then provided from ICs on the wafer are received by the test head 8 and transmitted to the test controller 4. The test head 8 contains a set of tester channels. Typically test data provided from the test controller 4 is divided into the individual tester channels provided through the cable 6 and separated in the test head 8 so that each channel is carried to a separate one of the probes 16. The channels from the test head 8 are linked to the probes 16 through electrical connections 24.

In most cases each of the probes 16 contacts a single input/output (I/O) terminal or pad on an IC of the wafer 14 being tested. Each tester channel may then either transmit a test signal to an IC input or monitor an IC output signal to determine whether the IC is behaving as expected in response to its input signals. FIG. 4 shows details where each tester channel is linked to a single probe. In FIG. 4, two signal channel transmission lines 31 and 32 are shown provided to two separate probes $16_1$ and $16_2$ contacting pads on two separate ICs $37_1$ and $37_2$ on the wafer 14. Each of the channel transmission lines 31 and 32 is driven by a respective driver 34 and 35, the drivers 34 and 35 typically being located in the test controller 4. Test data from the channel transmission lines 31 and 32 are distributed through the probe card 18 to the separate probes $16_1$ and $16_2$. Once testing is complete, the wafer is diced up to separate the ICs $37_1$-$37_4$.

Since there are usually more I/O pads than available tester channels, a tester can test only a portion of the ICs on the wafer at any one time. Thus, a "prober" holding a wafer must reposition the wafer under the probes several times so that all ICs can be tested. It would be advantageous due to test time savings and prevention of possible wafer damage due to multiple contacts with a test system if all ICs on a wafer could be contacted and tested concurrently without having to reposition the wafer.

One way to reduce the number of tester channels needed to test an entire wafer without repositioning the wafer is to distribute or fan out a single test channel to multiple lines, as generally illustrated in FIG. 1, potentially allowing the same tester channel to provide signals to I/O pads of a large number of ICs on a wafer. Although one channel can be fanned out, with fan out a fault identified in test results provided from one DUT may falsely appear in the test results of another DUT. For example a fault in the contact pad on one DUT which is shorted to ground will short the contact pad on a second DUT to ground, causing the second DUT to falsely test as bad. Further, an open circuit fault on one of the lines will render a wafer connected to the line untestable. Either a short or an open on a line will severely attenuate a test signal provided from the same channel to other lines intended for other DUTs.

One way of preventing a fault at or near any I/O pad from severely attenuating a test signal passing through the interconnect system is to place isolation resistors between the probes and a channel line branch point. The isolation resistors prevent a short to ground on one DUT from pulling the other DUT to ground, and likewise significantly reduce the attenuation resulting from an open circuit on one line. FIG. 7 of U.S. Pat. No. 6,603,323 entitled "Closed-Grid Bus Architecture For Wafer Interconnect Structure," describes the use of such isolations resistors. Although reducing the affect of faults, isolation resistors do not completely eliminate the attenuation caused by the faults. Further, with a parasitic capacitance on the lines, adding isolation resistors introduces an RC delay that can adversely affect the rise and fall time of test signals, potentially creating erroneous test results.

Another way to isolate faults without introducing resistor attenuation is to include an isolation buffer between each channel branch point and probe, as generally illustrated in FIG. 2, and as illustrated in more detail for a test system in FIG. 5. In FIG. 5, one transmission line channel 42 from a driver 40 of a tester is fanned out to two bus lines $50_1$ and $50_2$ in the probe card 18 to provide the channel signal to separate probes $42_1$ and $42_2$ for contacting pads on two ICs $37_1$ and $37_2$ (each labeled as a device under test "DUT"). Of course a channel could likewise be fanned out over multiple bus lines to multiple pads on the same IC.

A draw back to isolation buffers, as indicated previously, is that they introduce an uncertain delay into the transmission of test signals from the tester to the DUTs on a wafer. The delay is uncertain because the delay through a buffer can change with changes in temperature and power supply voltage. The signal delay from the tester to DUTs on a wafer can change during performance of a sequence of tests on DUTs of a wafer, creating inaccurate test results.

Another drawback to isolation buffers used in a test system is that the buffers prevent the tester from making DUT input pin open, short, and leakage tests sometimes referred to collectively as parametric tests. As described above, a buffer introduced in a channel will block the effects of a short or open circuit on one line from affecting another. Although this provides an advantage of isolating the branched lines, it will prevent deliberately testing using short or open circuit conditions. Similarly, leakage current from a DUT will be blocked from other lines by a buffer, a condition preventing measurement of leakage from a DUT.

It would be desirable to distribute a signal to multiple transmission lines and provide isolation from faults using buffers without introducing an unequal delay, and without preventing a tester from performing parametric tests on DUTs of a wafer.

SUMMARY

In accordance with the present invention, circuitry is provided to isolate faults using buffers without preventing a tester from performing leakage and parametric tests on DUTs of a wafer. Further, circuitry is provided to keep the delay through multiple isolation buffers constant.

With isolation buffers in a wafer test system having components according to the present invention, simply changing a probe card to one having channels branched through the isolation buffers provides for more efficient and cost effective system. With such branching the prober does not need repositioning to contact the wafer a number of times to test more DUTs, as would be required without using branches in the probe card. Simply substituting probe cards with the isolation buffers will also provide a significantly less expensive alternative to purchasing a new tester.

To provide parametric or other leakage tests with buffers included in channel line paths, buffer bypass elements are provided between the input and output of buffers in channel lines to allow leakage current to pass. During leakage or parametric test measurements, the buffers in lines being tested can be disabled allowing only leakage current to be measured through the buffer bypass elements. In one embodiment the buffer bypass element is a resistor of known value provided between the input and output of each buffer. In an alternative embodiment, a transmission gate is provided between the input and output of each buffer. Tri-state buffers can be used to enable the buffers to be disabled during leakage or parametric tests, as an alternative to disconnecting power and ground from the buffers.

Further according to the present invention, methods are provided for calibrating the remote buffers to effectively calibrate out buffer delay from test measurements. A first calibration method uses the leakage test mode, similar to the test mode for parametric testing, in conjunction with an active buffer, and further uses a time domain reflectometer (TDR) measurement. Discontinuities introduced by the buffer delay are detected in the TDR measurement of the leakage current, allowing the tester to compensate for the buffer delay. The second calibration method uses a separate tester channel without a buffer delay, and makes a comparison with the buffer delayed channel to eliminate buffer delay. Provided all the buffers were on the same wafer, the second method can apply the same measured buffer delay to all buffered channels. A third method uses a wafer or DUT with a known delay, such as a delay measured using a non-buffered probe card.

The buffered probe card timing would then be adjusted such that the buffered probe card timing test results indicate the delay of the known device.

To assure isolation buffer delay is uniform, buffer delay is controlled by a central delay control circuit that controls the power supply voltage or current provided to each isolation buffer. The delay control circuit includes an oscillator providing a signal to the input of a reference delay line and a reference buffer. The reference delay line and reference buffer then provide inputs to a phase comparator. The reference delay line has a length chosen to set the delay of the isolation buffers. The output of the phase comparator is provided through a loop filter to drive the reference buffer, as well as the isolation buffers provided in branches. As configured, the delay control circuit effectively forms a delay-lock loop where the reference buffer will provide a delay equal to the reference delay line, as will each of the isolation buffers in the system.

Since varying the delay of the isolation buffers can also result in varying the output voltage of each isolation buffer, in a further embodiment two buffers are used in sequence between each channel branch point and probe. The first buffer has a variable delay control applied, while the second buffer has no delay control and can supply the system voltage at its output unaltered.

BRIEF DESCRIPTION OF THE DRAWINGS

Further details of the present invention are explained with the help of the attached drawings in which.

DETAILED DESCRIPTION

Figure 1:
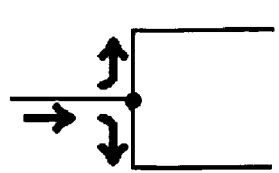
FIG. 1 shows a single transmission line fanned out to multiple signal lines.
Figure 2:
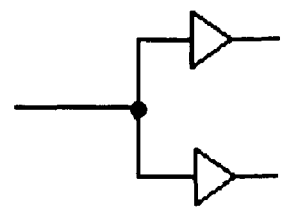
FIG. 2 shows a single transmission line fanned out to multiple lines with isolation buffers provided in the multiple lines.
Figure 3:
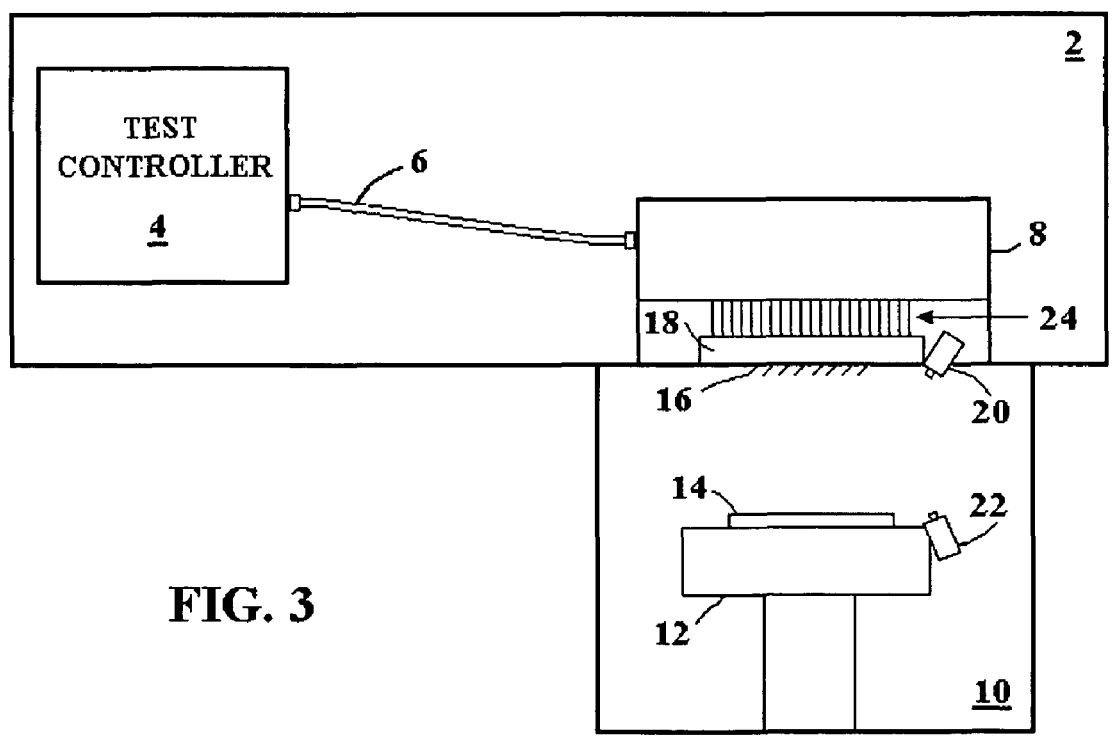
FIG. 3 shows a simplified block diagram of a conventional test system for testing ICs on a semiconductor wafer.
Figure 4:
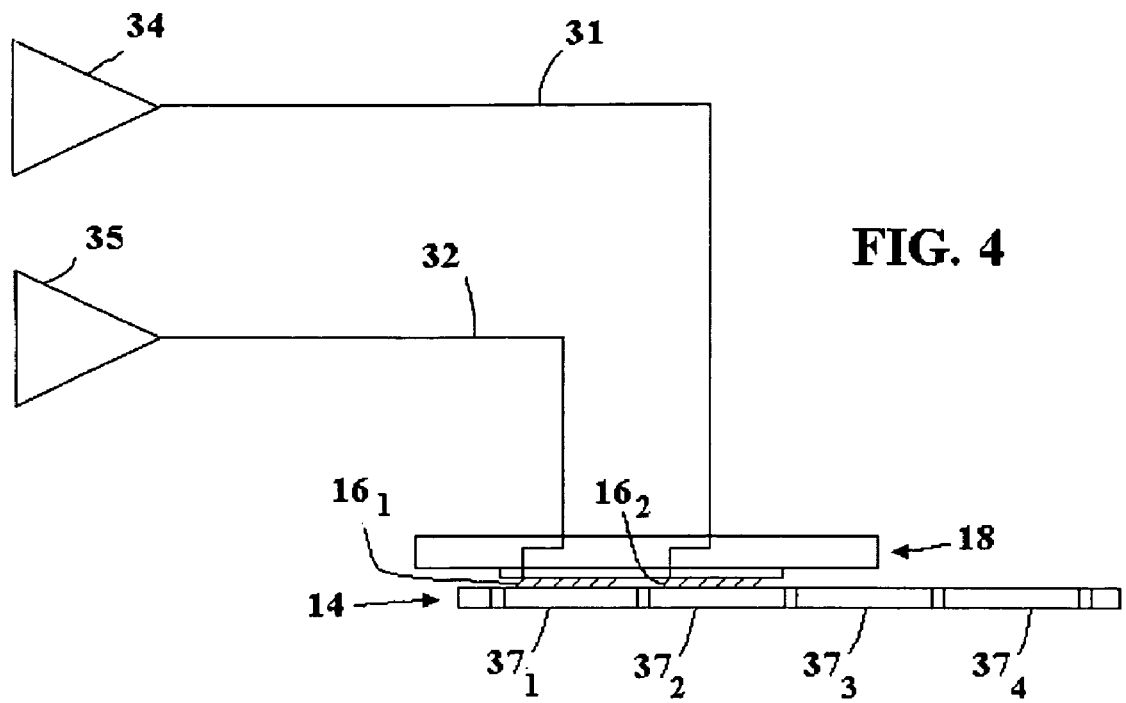
FIG. 4 illustrates a conventional test system arrangement where each channel is linked to a single probe.
Figure 5:
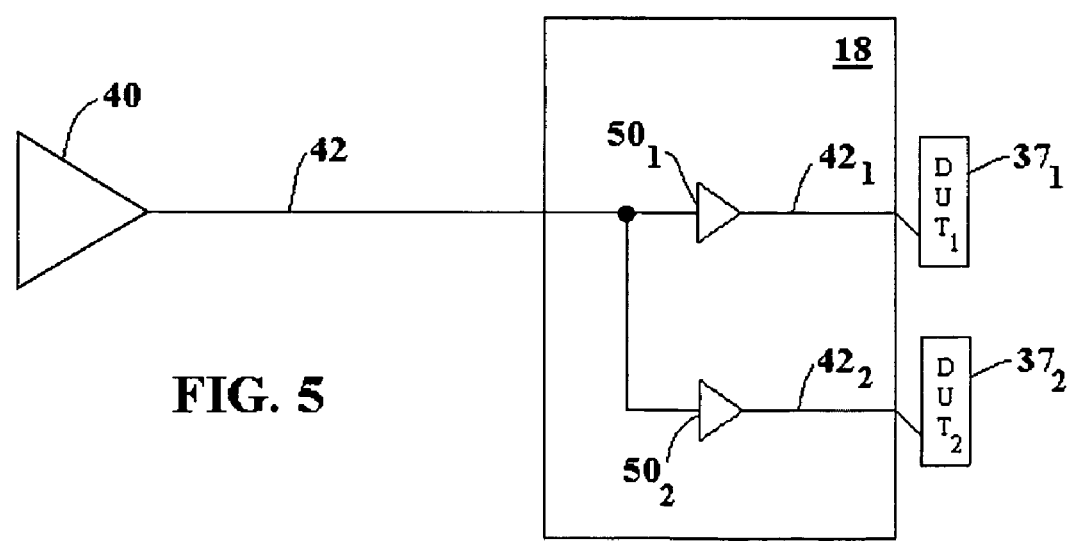
FIG. 5 illustrates how a single channel of a wafer tester can be fanned out to multiple probes with isolation buffers for concurrently testing multiple ICs using the single channel.
Figure 6:
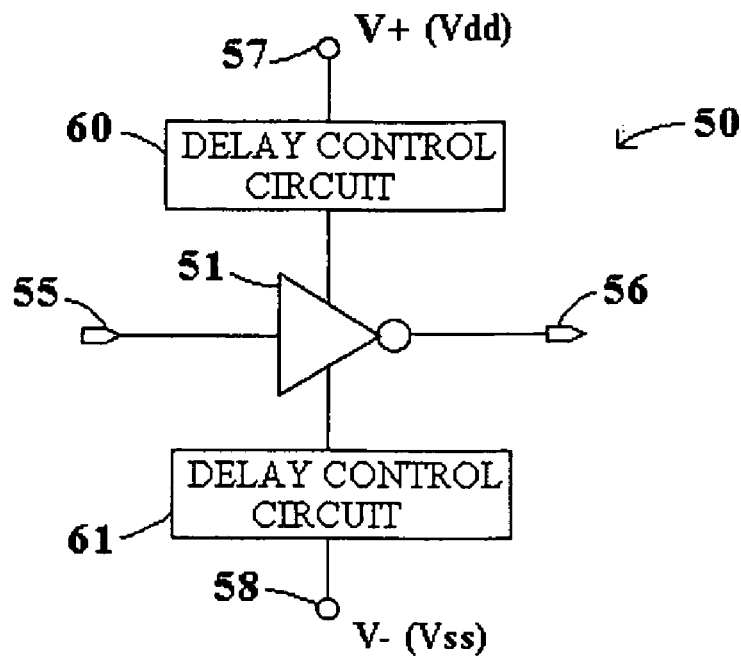
FIG. 6 shows one embodiment of an isolation buffer with delay controlled by changing the power supply bias voltage supplied to the buffer.

FIG. 6 shows an embodiment of the isolation buffer 50 with delay control which can change the bias voltage supplied to the buffer 50. In FIG. 6, the buffer 50 includes an inverter 51 having a signal input 55 and output 56. The system power supply voltage rails 57 and 58 carry a high voltage V+ and a low voltage V−. With CMOS devices, the bias or power supply voltages are typically referred to as Vdd and Vss. Typically, the rail voltages V+ and V− are supplied directly to the buffer. The voltage V+, for example, may be 5 volts, while V− may be ground or zero volts. However, in FIG. 6 with the delay control circuit set to control delay by varying power supply voltage, the voltage rails V+ and V− are provided through respective delay control circuits 60 and 61 as the high and low power supply voltages to inverter 51. Although shown as two separate delay control circuits 60 and 61 in FIGS. 5 and 6, a single combined circuit can be used. Further, although two circuits 60 and 61 are described to vary both the V+ and V−voltages, either one of the voltages V+ or V− can be varied alone to achieve the desired delay.

Although it has been described to control buffer delay by changing the voltage supplied to the buffer, a problem with doing so is that a change in the voltage supplied to a buffer, such as inverter 51, changes the high and low voltages supplied at its output 56. In accordance with the present invention, this problem is addressed by implementing each isolation buffer as a pair of inverters (e.g., CMOS inverters), as illustrated in FIG. 7.

Figure 7:
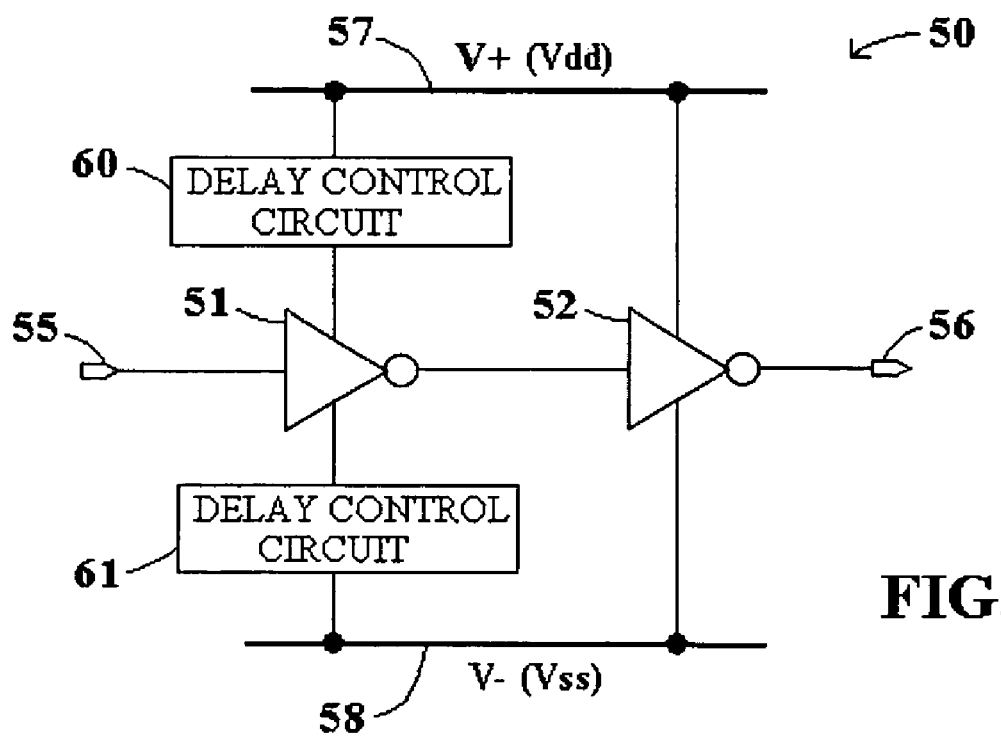
FIG. 7 illustrates an isolation buffer formed by two series inverters, with only the first having a power supply bias voltage altered.

FIG. 7 illustrates such an implementation where a buffer is formed by modifying FIG. 6 to add an inverter 52 in series with the inverter 51. With delay controlled by changing power supply bias voltage, only the voltage supplied to the first inverter 51 is changed to control its delay. The power supply bias voltage to the second inverter 52 remains fixed at the V+ and V−rails. Because the output of the second inverter 52 is the output 56 of the overall buffer 50, the high and low output voltages of the overall buffer 50 are fixed at the V+ and V− rails. Because the isolation buffer output in some cases must remain fixed at the V+ and V− rails, the circuit of FIG. 7 uses the second inverter 52 with a fixed power supply voltage.

With a different delay control circuit provided for each isolation buffer, temperature and device characteristics may vary the delay between isolation buffers. A single delay control circuit to control the delay provided by each isolation buffer is, therefore, preferable. Use of a single delay control circuit for multiple isolation buffers, as opposed to multiple delay control circuits, can also significantly reduce overall circuitry required for a test system.

Figure 8:
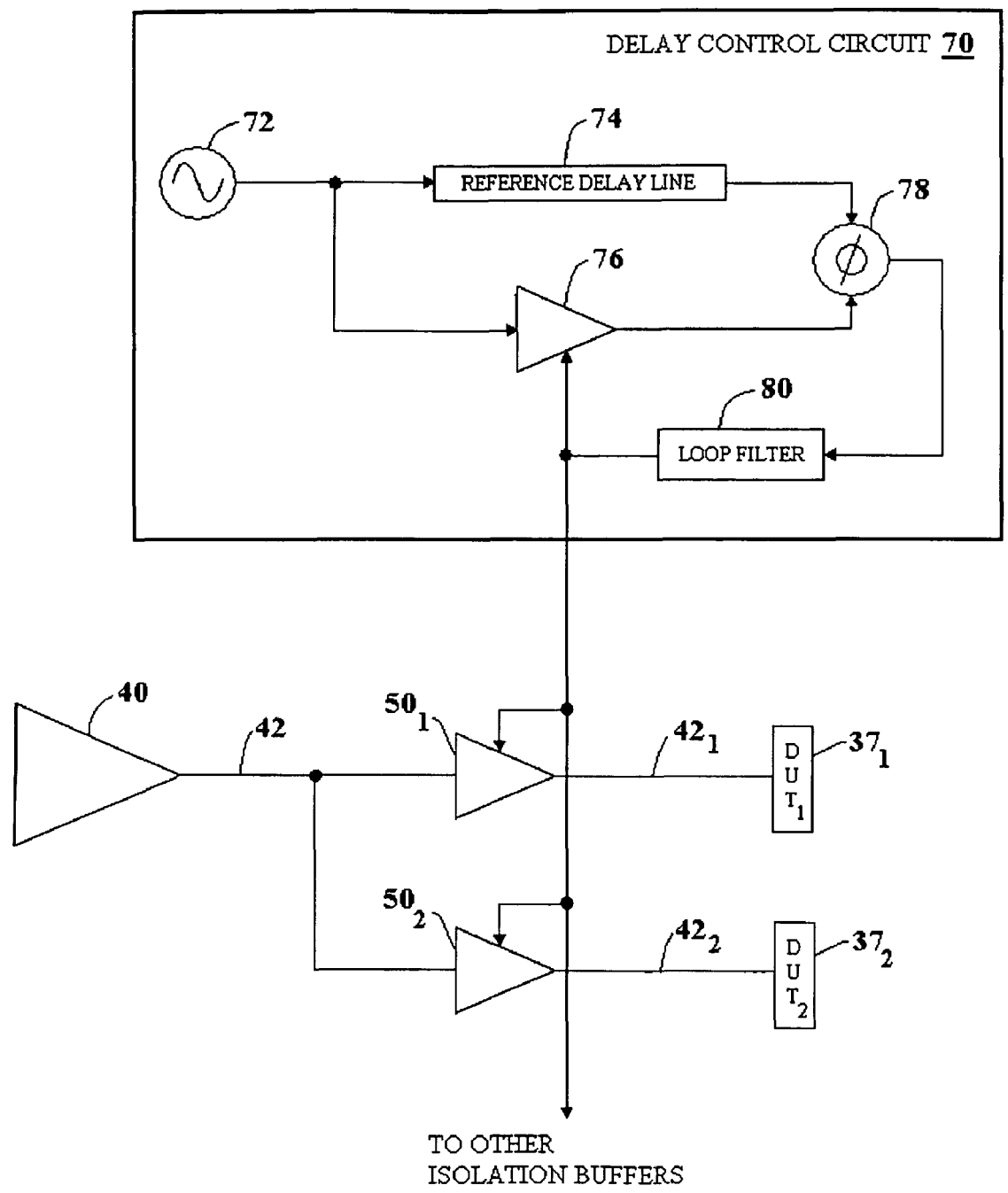
FIG. 8 shows details of a delay control circuit for controlling the delay of multiple isolation buffers.

Details of a single delay control circuit for controlling the delay of multiple buffers are shown in FIG. 8. The delay circuit 70 is shown connected to two isolation buffers $50_1$ and $50_2$ of a wafer tester configuration, similar to FIG. 5. However, the delay control circuit 70 can likewise be provided to more than two isolation buffers, or provided in branches of other types of circuits than a wafer tester such as a clock tree. Further, as would be understood by a person of ordinary skill, the delay control circuit 70 shown can be configured to function as a combination of the delay control circuits 60 and 61 shown in FIGS. 5 and 6, or individual ones of the delay control circuits 60 and 61.

The delay control circuit 70 includes an oscillator or clock generator 72 for creating a periodic signal provided to inputs of both a reference delay line 74 and a reference buffer 76. The oscillator can be formed from series connected inverters, or an inverter in series with a delay element such as a resistor. The oscillator signal frequency and duty cycle are not critical since an error signal is only derived from the rising and falling edges of the same period or cycle of the oscillator that is simultaneously input to the reference delay line 74 and reference buffer 76.

The reference delay line 74 is constructed to have a delay equal to the desired delay through isolation buffers $50_1$ and $50_2$. The dimensions of the reference delay line 74 line can be set, as would be understood by a person of ordinary skill in the art, to control the delay through the delay line 74. The reference delay line 74 can be constructed either on an integrated circuit containing the isolation buffers $50_1$ and $50_2$, reference buffer 76, phase comparator 78, etc., or it can be provided external to such an integrated circuit. Since the physical dimensions of components on an integrated circuit can be controlled lithographically, part-to-part variations can be minimized. In demanding applications where more precise control of the absolute or relative delay is required, laser trimming can be applied to tune the delay line 74. Without laser trimming, slight variations in the transmission line delay may be introduced due to the Tce of the materials or substrate used to construct the transmission line. In these cases, the relatively small delay variations of the transmission line can be stabilized by tuning the delay locked loop.

The phase comparator 78 measures the difference in phase of the outputs from the reference delay line 74 and the reference buffer 76. The output of the phase comparator 78 drives a low pass filter, or loop filter circuit 80. The filter 80 filters the phase comparator signal to generate a control voltage that is proportional to the phase error. This phase error control voltage is then used to adjust the delay of the reference buffer 76. The combination of the voltage controlled reference buffer 76, phase comparator 78 and low pass filter 80 is commonly referred to as a "delay-lock loop." The delay control circuit 70, thus, provides a time process and temperature independent reference to the reference buffer 76 and further applies the control voltage to multiple isolation buffers, such as $50_1$ and $50_2$.

The delay control circuit 70 of FIG. 8 forces the delay through the reference buffer 76 to match the delay through the reference delay line 74. Because the delay through the reference delay line 74 is not typically changed by ambient conditions (e.g., temperature or voltage of the power supply), the delay control circuit 70 keeps the delay through the reference buffer 76 constant, despite changes in the ambient temperature or voltage of its power supply.

The delay control circuit 70 of FIG. 8 further controls the bias voltage of isolation buffers $50_1$ and $50_2$ which are provided in branches $42_1$ and $42_2$ between a single channel 42 and DUTs $37_1$ and $37_2$. Thus, the delay control circuit 70 tends to keep the delay through the reference buffer 76 and isolation buffers $50_1$ and $50_2$ constant. Although two isolation buffers 50₁ and 50₂ are shown, additional buffers provided to other branches can have delay controlled by the circuit 70, as illustrated.

The delay control circuit 70 can be connected to control either, or both of the voltages V+ and V− supplied to the reference buffer 76 and the isolation buffers 50₁ and 50₂ to set the buffer delay. Thus, the connection from the loop filter 80 can be either a single line to provide an altered voltage from one of V− or V+, or a bus with two lines to provide a voltage altered from each of V+ and V−.

To assure the delay between buffers is substantially the same, the reference buffer 76 and isolation buffers 50₁, 50₂, etc. should be as similar as possible, or at least as similar as necessary to keep the delay through isolation buffers 50₁ and 50₂ within an acceptable difference. Preferably, the reference buffer 76 and isolation buffers 50₁ and 50₂ are manufactured on the same wafer, and can possibly be provided on the same IC chip to assure similar device and temperature characteristics.

The reference buffer 76 and isolation buffers 50₁ and 50₂ can be either the single inverter configuration shown in FIG. 6, or series inverters shown in FIG. 7. With the single inverter configuration of FIG. 6, the delay control circuit 70 controls either or both of the power supply voltages supplied to all of the buffer inverters. With the series inverter configuration of FIG. 7, the delay circuit 70 controls the supply bias voltage of the first inverter in the series, while the power supply voltages remain fixed at V+ and V− for the second series inverter. With the isolation buffer configuration of FIG. 7, both the reference buffer 76 and the isolation buffers 50₁ and 50₂ preferably include series inverters to maximize the similarity between the reference and isolation buffers so that delay is precisely controlled to a substantially identical value in each buffer.

Figure 9:
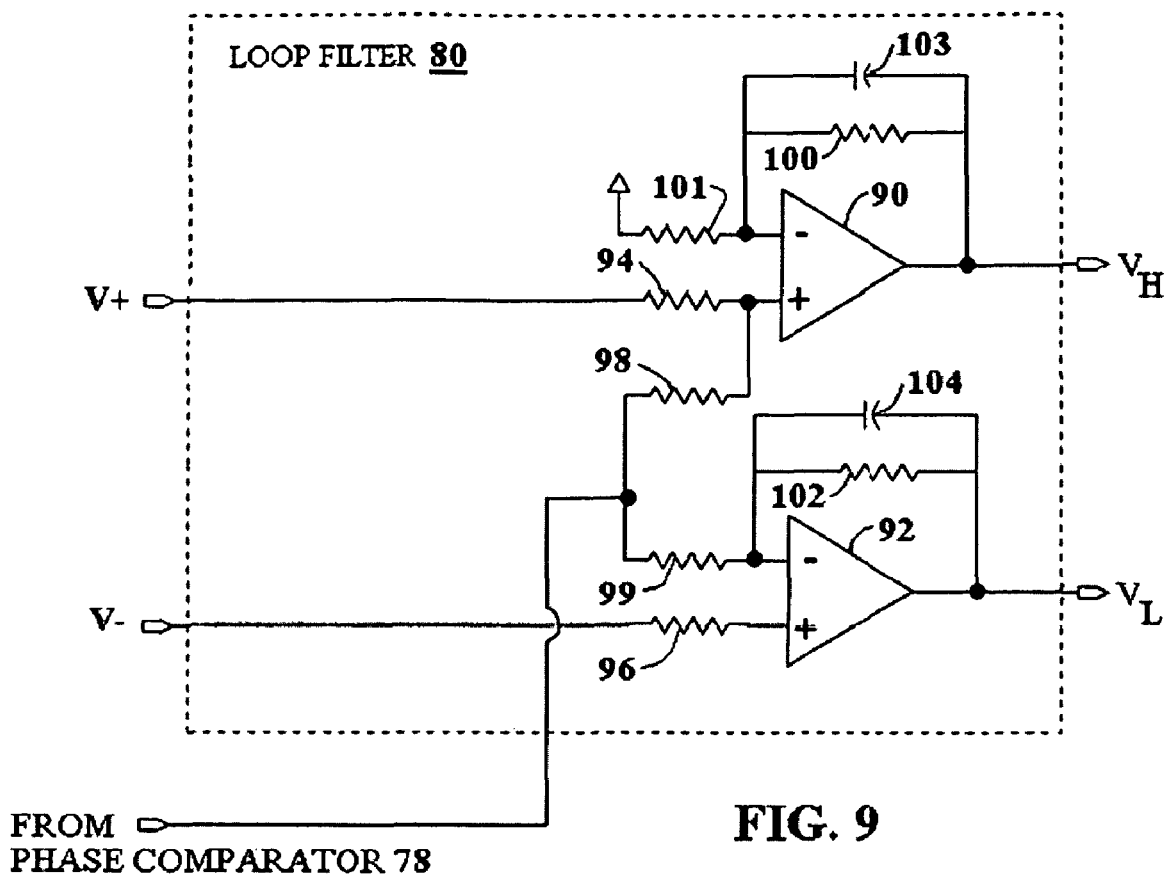
FIG. 9 shows details of an embodiment of the loop filter of FIG. 8.

FIG. 9 shows details of one embodiment for the low pass filter, or loop filter 80. The loop filter 80 functions to integrate the output of the phase comparator 78, shown in FIG. 8, and provide two centralized delay control voltages $V_H$ and $V_L$ to the reference buffer 76 and isolation buffers 50₁ and 50₂ centered between the V+ and V− system voltage rails. The circuit shown in FIG. 9 provides one embodiment for the loop filter 80, but the filter design is not critical and can be replaced by another low pass filter circuit configuration as would be understood by a person of ordinary skill. For example, a passive low pass filter using capacitors and resistors could replace the loop circuit 80 shown in FIG. 9 which includes active element amplifiers 90 and 92.

The loop filter circuit 80 of FIG. 9 receives as inputs the power supply rail voltages V+ and V− and the output of the phase comparator 78. From these inputs, the circuit of FIG. 9 generates control voltages $V_H$ and $V_L$. The voltage $V_H$ is provided as a high power supply input (i.e., the Vdd input for a CMOS inverter) to the reference buffer 76 and isolation buffers, while $V_L$ is provided as a low power supply input (i.e., the Vss input for a CMOS inverter) to the reference buffer 76 and isolation buffers.

The loop filter 80 includes two differential amplifiers 90 and 92. The output of amplifier 90 provides the control voltage $V_H$, while the output of amplifier 92 provides the control voltage $V_L$. A resistor 94 connects the rail voltage V+ to the non-inverting (+) input of amplifier 90, while a resistor 96 connects the rail voltage V− to the non-inverting (+) input of amplifier 92. The output from the phase comparator 78 is connected through a resistor 98 to the non-inverting (+) input of amplifier 90 and through a resistor 99 to the inverting (−) input of amplifier 92. Feedback is provided in amplifier 90 by a resistor 100 and capacitor 103 connecting its output to its inverting (−) input, along with a resistor 101 connecting the inverting input to ground. Feedback is provided in amplifier 92 by a resistor 102 and capacitor 104 connecting its output to its inverting (−) input. The feedback capacitors 103 and 104 enable the amplifiers 90 and 92 to function as integrators to reduce noise. The resistors 94, 96, 98 and 99 function to assure the voltages $V_H$ and $V_L$ are centered between V+ and V−.

To drive a large number of buffers, power amplifiers may be added to amplify the $V_H$ and $V_L$ outputs. It may also be desirable to place capacitors between the $V_H$ and $V_L$ outputs and the respective inputs of the isolation buffers. Such capacitors filter out high frequency noise from the power supply.

The circuit of FIG. 9 is designed to keep the digital signal at the output of an isolation buffer from having its power supply inputs varied, but centered between the V+ and V− power supply levels. By doing so, the transition of a subsequent circuit will occur at approximately an equal time on the rising or falling edge of a signal as it would if the V+ and V− levels remained unaltered. By not having the output of the isolation buffer centered between V+ and V−, one edge would trigger a subsequent circuit transition sooner than normal possibly causing erroneous test results to occur.

With the circuitry shown in FIG. 9, the greater the phase difference signal output from the phase comparator 78, the greater the difference between $V_H$ and $V_L$. When applied to the isolation buffers, the greater the difference between $V_H$ and $V_L$ from the buffer delay control circuit 70, the less the delay provided by the isolation buffers.

Figure 10:
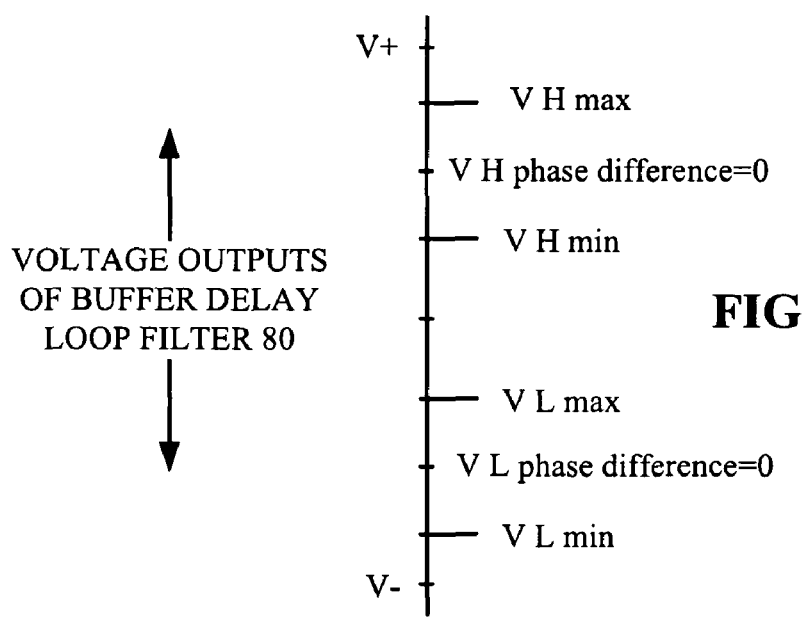
FIG. 10 shows a chart illustrating operating ranges for the $V_H$ and $V_L$ signals output from the circuit of FIG. 9.

FIG. 10 shows a chart illustrating operating ranges for the $V_H$ and $V_L$ signals output from the circuit of FIG. 9. The ranges of $V_H$ and $V_L$ will depend on values chosen for resistors 94, 96, 98 and 99. The resistors 94, 96, 98 and 99 are preferably chosen so that with changes in phase difference, an equal variation occurs in $V_H$ and $V_L$ to assure the centerline voltage between $V_H$ and $V_L$ remains the same. The values of the resistors are further chosen so that $V_H$ is in the middle of its total range and $V_L$ is in the middle of its total range when the phase difference output signal from the phase comparator 78 is 0. The specific range for $V_H$ and $V_L$ will vary depending on the needs of the particular circuit being implemented.

Figure 11:
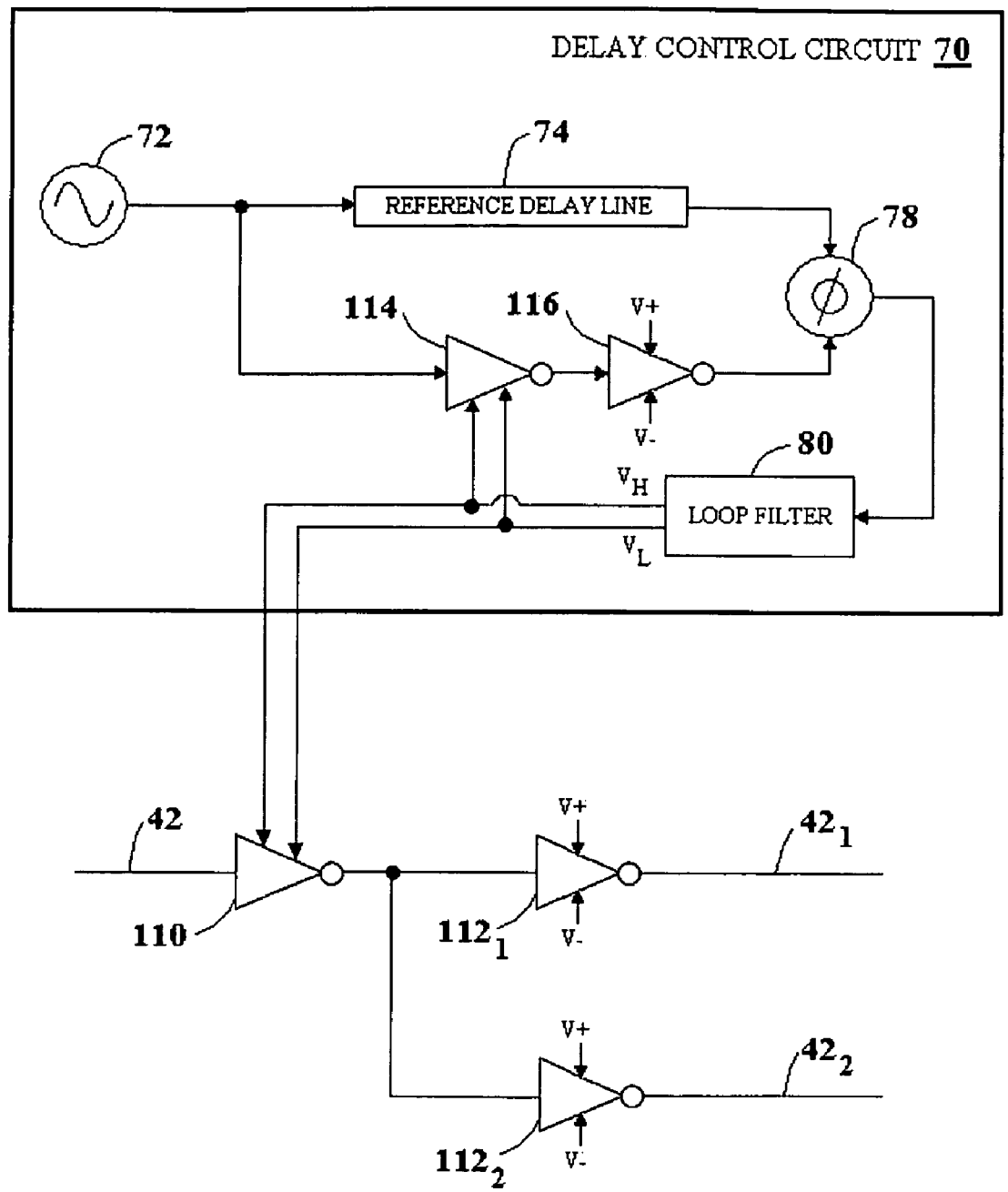
FIG. 11 shows an alternative to the circuit of FIG. 8 with a variable supply voltage isolation buffer placed before a channel branch point, and a fixed voltage buffer provided in each branch.

FIG. 11 shows an alternative to the isolation buffer and delay control circuit of FIG. 8, configured to reduce the overall circuitry required. In FIG. 11, a single variable delay isolation buffer 110 is placed in the channel or transmission line 42 prior to a branch point. The isolation buffer 110, shown as an inverter, receives variable power supply bias signals $V_L$ and $V_H$ from the delay control circuit 70 to set its delay. Fixed delay buffers 112₁ and 112₂, are then included in the branches 42₁ and 42₂ after the fan out point. The buffers 112₁ and 112₂, also shown as inverters, receive fixed power supply inputs V+ and V− from the system power supply rails. Although two buffers 112₁ and 112₂ are shown, the fan out could be to more than two buffers.

Series inverters 114 and 116 in FIG. 11 serve in place of the reference buffer 76 of FIG. 8. Inverter 114 receives the variable power supply bias signals $V_L$ and $V_H$ from the loop filter 80. Inverter 116 receives the fixed power supply rails V+ and V−. All of the inverters are preferably made as similar as possible, including being made on the same semiconductor wafer to create similar device and temperature variation characteristics. As such, the circuit of FIG. 11 provides fan out from a common channel with isolation buffers creating a uniform delay. The circuit of FIG. 11 provides an advantage over the circuit of FIG. 8 using buffers as shown in FIG. 7 since only a single buffer is required in each branch point.

Figure 12:
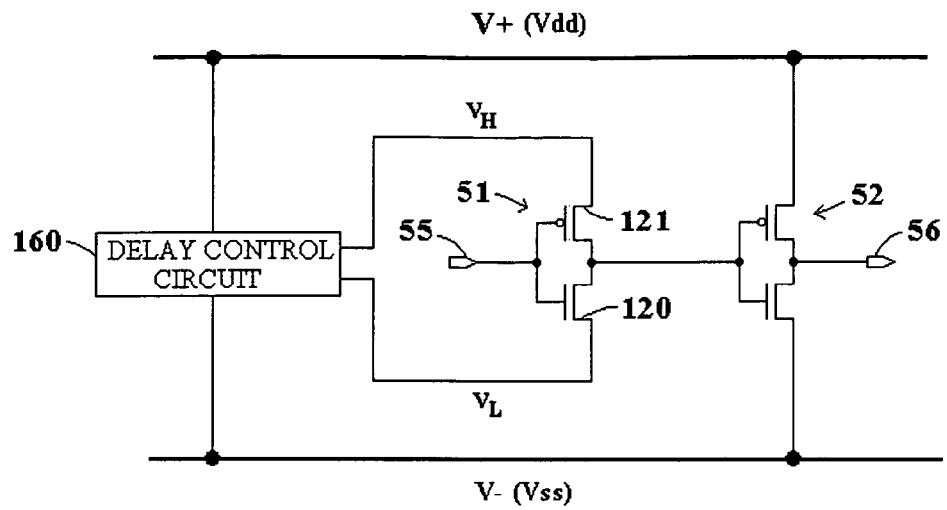
FIG. 12 illustrates an embodiment for the isolation buffer of FIG. 7 formed by series CMOS inverters, the first series CMOS inverter having delay controlled by a single delay control circuit.

FIG. 12 illustrates an embodiment for the isolation buffer of FIG. 7 formed by series CMOS inverters, the inverter 51 having delay controlled by a single delay control circuit 160, while the inverter 52 has a fixed delay. The delay control circuit 160 combines the functions of circuits 60 and 61 of FIG. 7, similar to delay control circuit 70 of FIG. 11. The CMOS inverter 51 includes a PMOS transistor 121 and NMOS transistor 120 that receive the delay control voltages $V_H$ and $V_L$ generated from delay control circuit 160, similar to the circuit 70 of FIG. 11. The CMOS inverter 52 likewise includes a PMOS and an NMOS transistor, with the transistors driven by the fixed V− and V+ voltage rails.

Figure 13:
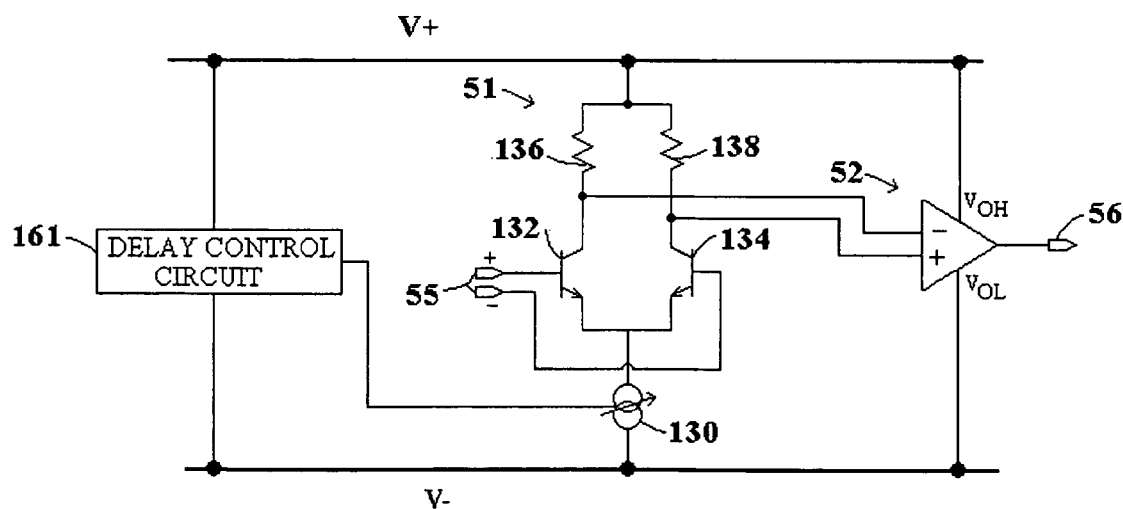
FIG. 13 illustrates an embodiment with an isolation buffer configured as a differential amplifier having delay controlled by varying current through the differential amplifier.

FIG. 13 illustrates an isolation buffer configuration with delay controlled by varying current, as opposed to varying voltage in the circuit of FIG. 12. FIG. 13 further illustrates that buffers can take other configurations, such as differential amplifiers made using bipolar junction transistors (BJTs), as opposed to CMOS inverters. As shown, buffer 51 in FIG. 13 is a differential amplifier with a current sink 130 having current controlled by a delay control circuit 161. In one embodiment, the delay control circuit 161 can be configured as the circuit 70 of FIG. 8. In such a configuration for delay control circuit 161, the output of the loop filter 80 of FIG. 8 would supply current inputs of the reference buffer 76 configured as a differential amplifier and the differential amplifier buffer 51. The buffer 51 of FIG. 13 includes BJT transistors 132 and 134 having bases forming + and − differential amplifier inputs, common emitters connected to the current sink 130, and collectors provided through resistors 136 and 138 to the V+power supply rail.

The differential amplifier 51 can be used alone, or if a rail-to-rail single output is desired, can be connected through a second amplifier 52 to the output 56. The differential amplifier 51 will not deliver rail-to-rail V+ and V− voltages, since the resistors 136 and 138 as well as current sink 130 limit the output swing. If a rail-to-rail output is desired, the amplifier 52 configured as a comparator, as shown in FIG. 13 with control voltages $V_{OH}$ and $V_{OL}$ connected to the V+ and V− rails, will provide the desired rail-to-rail swing.

Figure 14:
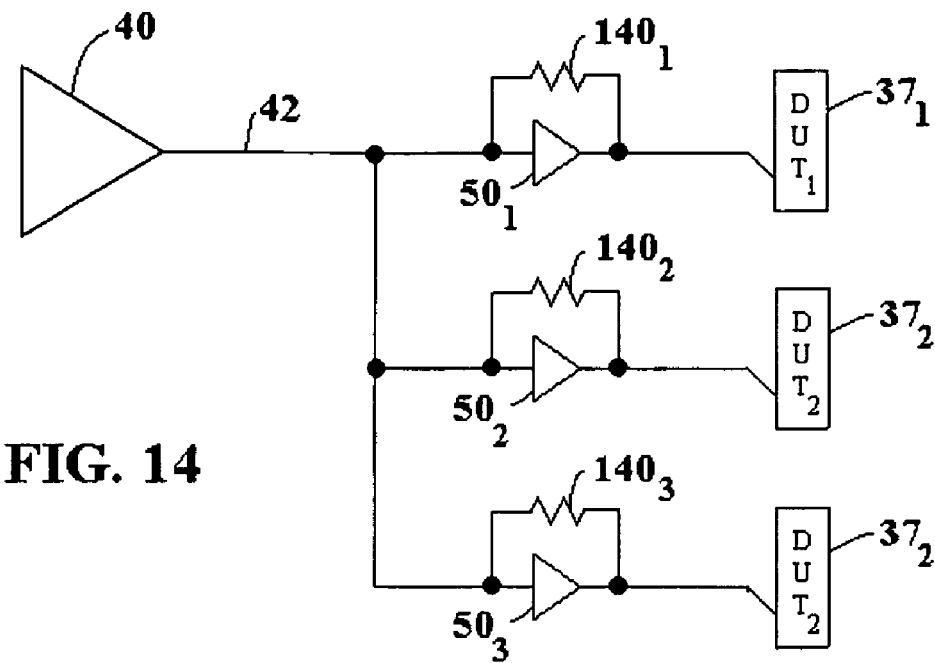
FIG. 14 shows isolation buffers provided in branches of a channel with buffer bypass elements provided by resistors to enable leakage current measurement.
Figure 15:
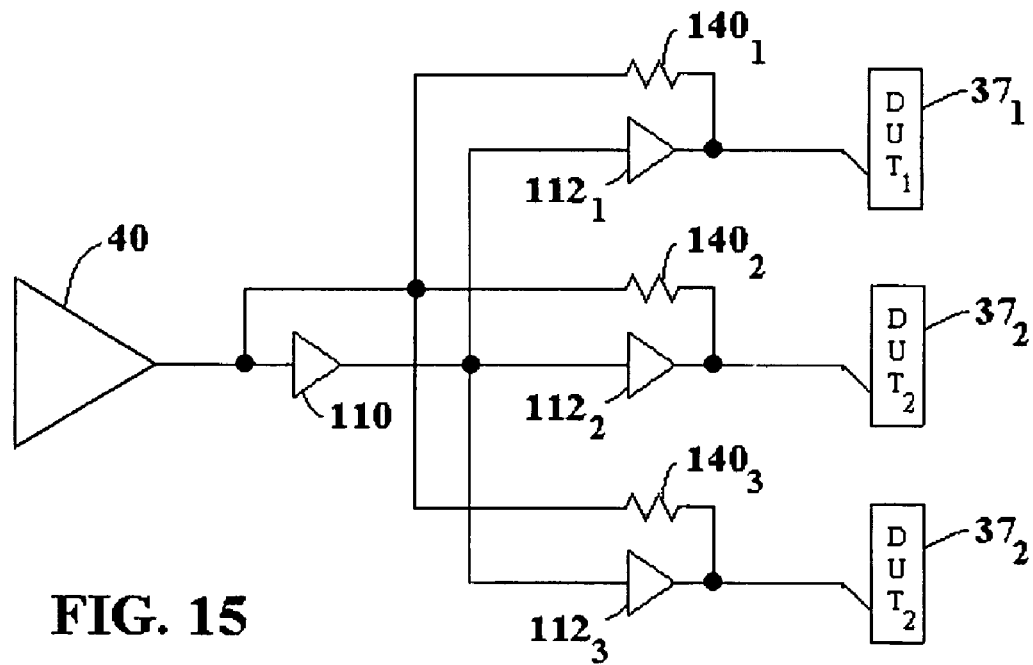
FIG. 15 illustrates modification to the circuitry of FIG. 14 to provide buffer bypass elements across multiple buffers.

FIG. 14 shows isolation buffers $50_{1-3}$ provided in branches of a channel 42 with buffer bypass elements provided by resistors $140_{1-3}$ between the input and output of the isolation buffers $50_{1-3}$ to enable leakage current measurement for parametric testing. The bypass elements provided using resistors $140_{1-3}$ allow for extremely low current leakage measurements. In order to accommodate the low leakage measurements, the resistors $140_{1-3}$ of known value are connected between the input and output of each buffer $50_{1-3}$. FIG. 15 illustrates modification to the circuitry of FIG. 14 to provide buffer bypass elements using resistors $140_{1-3}$ across multiple buffers 110 and $112_{1-3}$, similar to the arrangement of FIG. 11.

To measure leakage current with the configuration of FIGS. 14 and 15, during leakage measurements, the power and ground to all the buffers and to the DUTs not being measured are disconnected using either high impedance transistor switches or relays (not shown) that are provided between the power supply and the buffers and between the power supply and DUTs. A voltage is then forced through the resistors $140_{1-3}$ and the resulting current measured for all DUTs that remained connected to the power supplies. Buffers and unused DUTs are similarly disabled for parametric testing.

Figure 16:
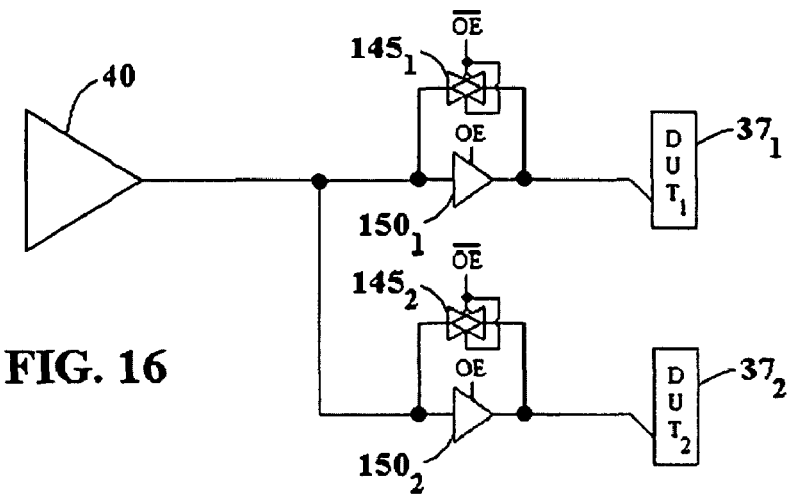
FIG. 16 shows isolation buffers provided in branches of a channel with buffer bypass elements provided using transmission gates for leakage testing.
Figure 17:
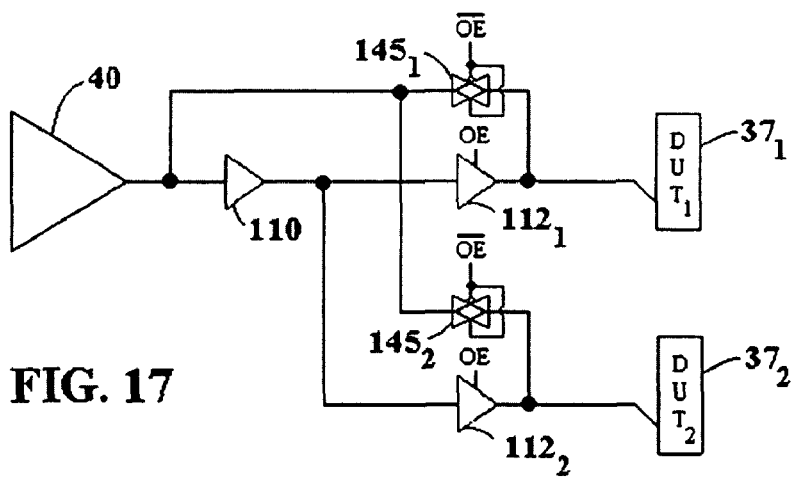
FIG. 17 illustrates modification to the circuitry of FIG. 16 to provide buffer bypass elements across multiple buffers.

FIG. 16 shows another embodiment for providing buffer bypass elements using transmission gates $145_{1-2}$ to enable leakage and parametric testing with buffers $150_{1-2}$ provided in the channels. The transmission gates $145_{1-2}$ are provided between the input and output of each buffer $150_{1-2}$. The transmission gates $145_{1-2}$ can be formed as a standard CMOS device with PMOS and NMOS transistors having source-drain paths connected in parallel, and gates connected together through an inverter to provided a control input. The transmission gates $145_{1-2}$ can likewise be formed from a single PMOS or NMOS transistor with a source-drain path connected across the buffer and a gate providing control. Transmission gates can likewise be formed using different transistors types, such as by using BJT transistors. FIG. 16 illustrates modification to the circuitry of FIG. 17 to provide buffer bypass elements across multiple buffers 110 and $112_{1-2}$ using transmission gates $145_{1-2}$, if desired.

To provide parametric tests with the transmission gates $145_{1-2}$, in one embodiment the buffers $150_{1-2}$, or $112_{1-2}$ are put in a tri-state mode while the transmission gates connected to DUTs to be tested are enabled. To illustrate this, the output enable signal OE is shown provided with opposite polarity to enable the tri-state buffers and the transmission gates at different times in FIGS. 16-17. This embodiment would be appropriate for measuring larger leakage values, and would not require disconnecting power and ground of the buffer device. Similarly, power could remain connected to DUTs not being tested. With the configuration of FIG. 17, the buffer 110 is not a tri-state buffer since its signal path is blocked by buffers $112_{1-2}$. However, it may be desirable to have buffer 110 as a tri-state device if leakage from its will affect test measurements. The configuration of FIG. 17 further uses less lines from a delay control circuit, as described with respect to FIG. 11.

The present invention further provides methods to calibrate a system with buffers having buffer bypass elements as described according to the present invention. The calibration provides an indication of delay through the buffers so that buffer delay can be calibrated out of test results made using a channel line containing the buffer. The calibration procedures can be performed using any of the circuit configurations shown in FIGS. 14-17.

The first calibration method uses a test of leakage current provided through the buffer bypass element (enabled in a leakage test mode) in conjunction with the buffer or buffers being active, and further in conjunction with a conventional time domain reflectometer (TDR) measurement. Discontinuities introduced by a buffer delay are detected and measured using a TDR comparator thus allowing a tester of a test system to calculate and compensate for the buffer in a test system by subtracting out the buffer delay. In the TDR measurement a test pulse is provided, and reflection pulses are measured from a buffer input and output. The time difference between receipt of the reflections from the input and output of the buffer is used to determine a delay through the buffer. A similar calculation is used for other buffers, if multiple buffers are provided in series in a channel.

Figure 18:
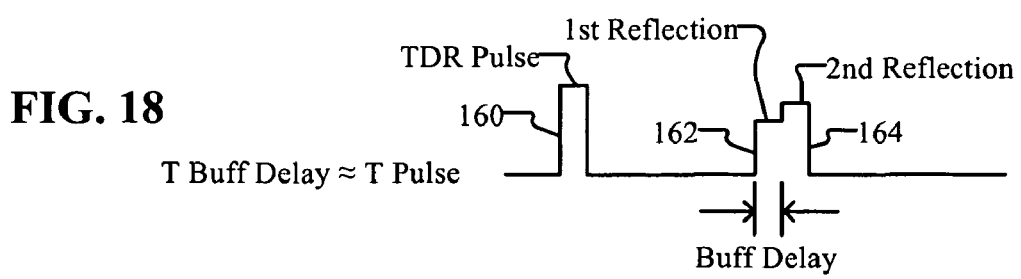
FIGS. 18-19 are timing diagrams illustrating determining buffer delay using time domain reflectometer (TDR) measurements.
Figure 19:
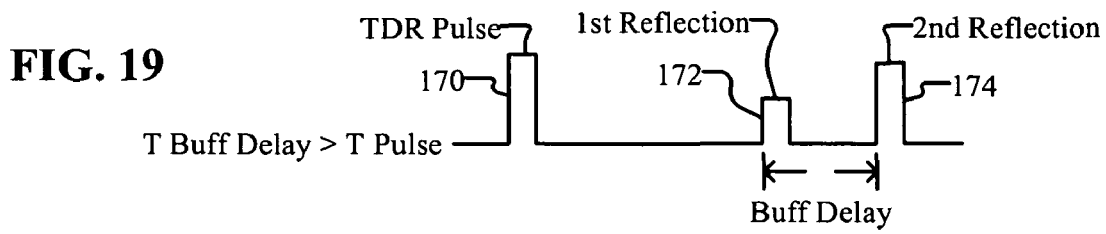

FIGS. 18-19 are timing diagrams illustrating determination of buffer delay using TDR measurements with buffers providing different length delays. FIG. 18 shows a pulse 160 provided from a TDR measurement device, and resulting return reflections 162 and 164 from the input and the output of a buffer where the pulse is approximately equal to the buffer delay. As shown in FIG. 18, the buffer delay is determined by measuring the time difference between the rising edges of the reflections 162 and 164 from the input and output of the buffer. FIG. 19 shows a pulse 170 provided from a TDR device and resulting return reflections 172 and 174 where the pulse is smaller than the buffer delay. Although reflection pulses 172 and 174 from the input and output of the buffer are separated, a similar measurement between the rising edge of the two reflected pulses 172 and 174 determines buffer delay.

In a second calibration method to determine and remove buffer delay, a separate comparison test channel is used from the channel containing the buffer. Measurements are made to determine delay of a common device connected to the channels, and a comparison of the results is made, the difference indicating the buffer delay. Provided all the buffers in the test system were on the same die, or from the same wafer and at the same temperature, this method allows the buffer delay determination for one buffer to be used as the buffer delay for all buffered channels.

In a third calibration method to determine and remove buffer delay, a wafer or other DUT that has a known or calibrated delay is used. The delay of the test device can be determined using a non-buffered channel. A measurement is then made with the buffered channel, and the measurement of the buffered channel is adjusted to effectively calibrate out any delay resulting from the buffer by subtracting out delay other than the calibrated delay of the known device.

Although the present invention has been described above with particularity, this was merely to teach one of ordinary skill in the art how to make and use the invention. Many additional modifications will fall within the scope of the invention, as that scope is defined by the following claims.

What is claimed is:

1. A method of measuring the delay of a buffer in a test circuit, the method comprising:
    providing a signal pulse through the buffer;
    measuring the signal pulse as reflected from a buffer bypass element provided between an input and output of the buffer; and
    determining the delay introduced by the buffer from the reflected signal pulse using a time domain reflectometer calculation.

2. The method of claim 1, wherein the buffer output is connected to a test probe.

3. A method of measuring the delay of a buffer in a test circuit, wherein the buffer is provided in a first transmission line, the method comprising:
    measuring delay of the first transmission line and the buffer;
    measuring delay of a second transmission line substantially similar to the first transmission line without a buffer; and
    calculating the delay through the buffer by determining a difference between a delay through the first transmission line with the buffer and the delay through the second transmission line.

4. The method of claim 3, wherein a buffer bypass element is provided between an input and an output of the buffer.

5. A method of calibrating out a delay of a buffer in a test circuit, the method comprising:
    measuring a delay of a device having a known delay using the test device with the buffer; and
    calibrating out the delay of the buffer by comparing the measured delay of the device with the known delay.

6. The method of claim 5, wherein a buffer bypass element is provided between an input and an output of the buffer.

* * * * *